US010062942B2

(12) United States Patent
Kato

(10) Patent No.: US 10,062,942 B2
(45) Date of Patent: *Aug. 28, 2018

(54) HIGH-FREQUENCY TRANSMISSION LINE

(71) Applicant: Murata Manufacturing Co., Ltd., Nagaokakyo-shi, Kyoto-fu (JP)

(72) Inventor: Noboru Kato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/384,348

(22) Filed: Dec. 20, 2016

(65) Prior Publication Data

US 2017/0104257 A1  Apr. 13, 2017

Related U.S. Application Data

(63) Continuation of application No. 14/873,281, filed on Oct. 2, 2015, now Pat. No. 9,570,786, which is a (Continued)

(30) Foreign Application Priority Data

Jul. 9, 2013 (JP) ................................. 2013-143501

(51) Int. Cl.
*H01P 3/08* (2006.01)
*H05K 1/02* (2006.01)

(52) U.S. Cl.
CPC ............. *H01P 3/08* (2013.01); *H05K 1/0242* (2013.01)

(58) Field of Classification Search
CPC .............................. H01P 3/08; H05K 1/0242
(Continued)

(56) References Cited

U.S. PATENT DOCUMENTS 4,914,407 A * 4/1990 Itoh .......................... G02F 1/025
  331/107 SL
2004/0174228 A1 * 9/2004 Kanno ..................... H01L 23/66
  333/34

(Continued)

OTHER PUBLICATIONS

Kato, "High-Frequency Transmission Line", U.S. Appl. No. 14/873,281, filed Oct. 2, 2015.

*Primary Examiner* — Stephen E Jones
*Assistant Examiner* — Scott S Outten
(74) *Attorney, Agent, or Firm* — Keating & Bennett, LLP

(57) ABSTRACT

A transmission line portion of a high-frequency transmission cable includes a dielectric body in which a first ground conductor, a signal conductor, and a second ground conductor are arranged along a thickness direction of the dielectric body from a first principle surface side. The second ground conductor is arranged at a position that does not overlap the signal conductor when viewed in a direction perpendicular or substantially perpendicular to the first principle surface. The third ground conductor and the signal conductor are located at the same position in the thickness direction of the dielectric body. The second and third ground conductors are connected to the first ground conductor via interlayer-connector conductors. The width of the second and third ground conductors is narrower than the width of the signal conductor, but a sum of the widths of the second and third ground conductors is larger than the width of the signal conductor.

9 Claims, 11 Drawing Sheets

Related U.S. Application Data continuation of application No. PCT/JP2014/064911, filed on Jun. 5, 2014.

(58) Field of Classification Search
USPC .......................................................... 333/238
See application file for complete search history.

(56) References Cited

U.S. PATENT DOCUMENTS

| | | | | |
|---|---|---|---|---|
| 2010/0102425 A1* | 4/2010 | Ju | ........................ | H01L 23/552 |
| | | | | 257/685 |
| 2011/0241796 A1* | 10/2011 | Mina | ...................... | H01P 3/003 |
| | | | | 333/161 |

* cited by examiner $2W_{222} < W_{221}$ $2W_{222} < W_{221N}$

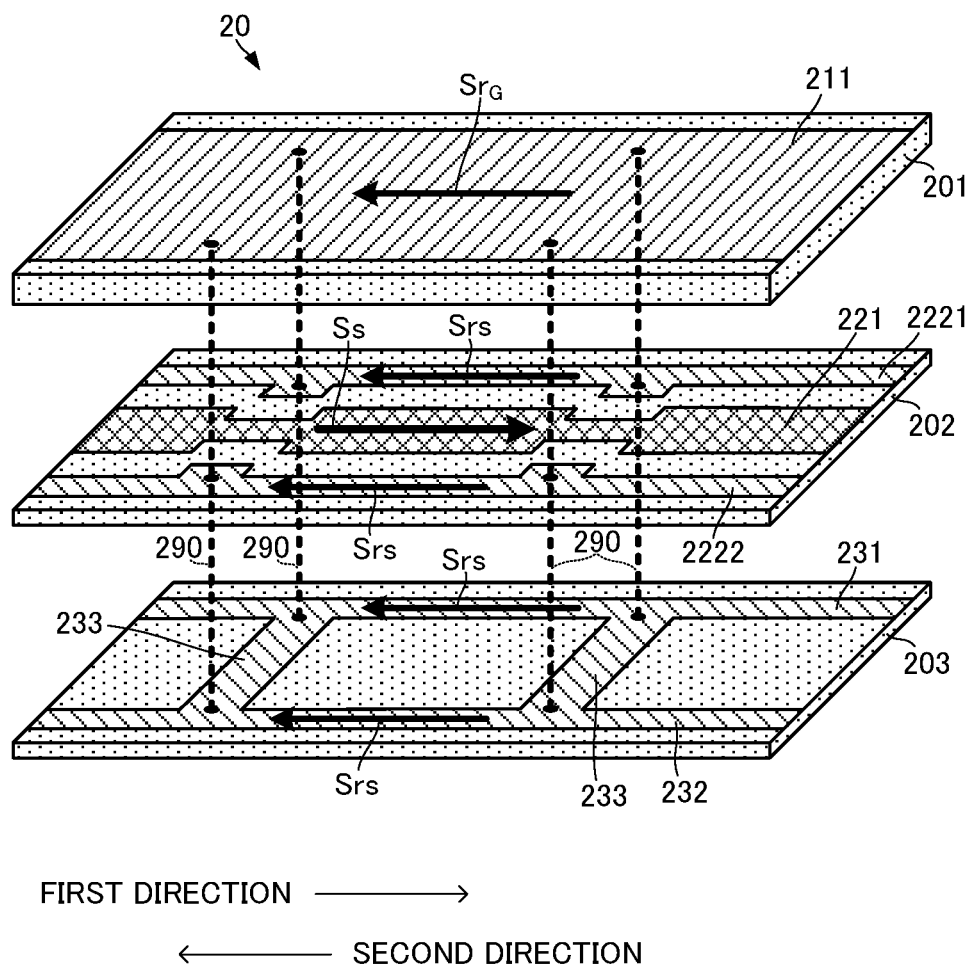

HIGH-FREQUENCY TRANSMISSION LINE

BACKGROUND OF THE INVENTION

1. Field of the Invention

The present invention relates to high-frequency transmission lines that transmit high-frequency signals.

2. Description of the Related Art

As a related art of a thin high-frequency transmission line that transmits high-frequency signals, a device having a structure such as described in Japanese Unexamined Patent Application Publication No. 2012-253362 has been proposed. A high-frequency transmission cable described in Japanese Unexamined Patent Application Publication No. 2012-253362 has a so-called triplate stripline structure. Specifically, a first ground conductor, a signal conductor, and a second ground conductor are arranged sequentially along the thickness direction of a plate-shaped dielectric body defining gaps in between. The first ground conductor and the second ground conductor are connected by via-conductor. The second ground conductor includes two elongated conductors extending along a longer-length direction of the dielectric body. The two elongated conductors are formed near both end portions of the dielectric body in a shorter-length direction perpendicular or substantially perpendicular to the longer-length direction. The two elongated conductors are connected to each other by bridge conductors arranged along the longer-length direction defining gaps in between. In this way, a plurality of openings is formed in the second ground conductor along the longer-length direction (extending direction). Forming the openings in this way makes the high-frequency transmission line more flexible.

Further, in order to set the impedance of the high-frequency transmission line to a desired value, it is desirable to suppress capacitive coupling between the signal conductor and the second ground conductor. Thus, the signal conductor and the second ground conductor are formed so as not to overlap with each other in a planar view of the high-frequency transmission line except at the bridge conductors. In the high-frequency transmission line described by Japanese Unexamined Patent Application Publication No. 2012-253362 in which the triplate stripline is adopted as a basic configuration, the following shortcoming may occur in a case where an attempt is made to narrow the width of the the high-frequency transmission line.

In the high-frequency transmission line described in Japanese Unexamined Patent Application Publication No. 2012-253362, because of high-frequency signal transmission, when a current (hereinafter, referred to as a signal current) flows in the signal conductor, a return currents are produced in the first ground conductor and the second ground conductor and flow in the opposite direction to the signal current.

Here, in order to make the width of the high-frequency transmission line narrow while making the signal conductor and the second ground conductor not overlap with each other in the planar view as described above, at least one of or both the conductor widths may need to be narrowed. On the other hand, in order to suppress transmission loss of the signal conductor, the width of the signal conductor cannot be narrowed. This inevitably necessitates a reduction in the width of the second ground conductor.

However, as described above, the return current flows in the second ground conductor. As the width of the second ground conductor becomes narrower, transmission loss due to the return current increases. This increases transmission loss of the whole high-frequency transmission line.

SUMMARY OF THE INVENTION

Preferred embodiments of the present invention provide a high-frequency transmission line that significantly reduces or prevents degradation of transmission loss even in a case where a narrower width is used.

A high-frequency transmission line according to a preferred embodiment of the present invention includes a dielectric body, a signal conductor, and first, second, and third ground conductors. The dielectric body has a plate-shaped configuration and includes a first principle surface and a second principle surface that oppose each other. The signal conductor extends in a predetermined direction and is provided at an intermediate position of the dielectric body in a thickness direction perpendicular or substantially perpendicular to the first principle surface and the second principle surface. The first ground conductor is disposed closer to the first principle surface than the signal conductor is. The second ground conductor is located closer to the second principle surface than the signal conductor is, but does not to overlap with the signal conductor in the thickness direction, and has a width narrower than a width of the signal conductor. The third ground conductor is located at a position different from a position of the second ground conductor in the thickness direction of the dielectric body, overlaps with the second ground conductor and does not overlap with the signal conductor, and is connected to the second ground conductor.

In this configuration, return currents flow in both the second ground conductor and the third ground conductor. Although the second ground conductor itself has a width narrower than the width of the signal conductor, the width of conductor in which the return currents flows is equal or substantially equal to a sum of the width of the second ground conductor and the width of the third ground conductor. Thus, the transmission loss due to the return current is reduced.

Further, in the high-frequency transmission line according to a preferred embodiment of the present invention, it is preferable that the third ground conductor and the signal conductor are located at the same position in the thickness direction.

In this configuration, the thickness of the dielectric body preferably are made thinner compared to a case where the third ground conductor and the signal conductor are located at different positions. Accordingly, the high-frequency transmission line is preferably made thin. Further, the third ground conductor and the signal conductor may be formed in a single process. Accordingly, a fabrication process of the high-frequency transmission line is greatly simplified.

Further, in the high-frequency transmission line according to a preferred embodiment of the present invention, the width of the second ground conductor and the width of the third ground conductor may be the same, or the width of the third ground conductor may be narrower than the width of the second ground conductor.

These configurations represent specific examples of the second ground conductor and the third ground conductor. Using the same width in the second ground conductor and the third ground conductor equalizes a resistance of the second ground conductor against the return current and a resistance of the third ground conductor against the return current. Making the width of the third ground conductor narrower than the width of the second ground conductor significantly reduces or prevents electromagnetic coupling between the third ground conductor and the first ground conductor.

Further, in the high-frequency transmission line according to a preferred embodiment of the present invention, the following configuration may also be used. The second ground conductor may include a first conductor and a second conductor that are arranged along a direction perpendicular or substantially perpendicular to the extending direction of the signal conductor defining a gap in between. The second ground conductor may further include bridge conductors that connect the first conductor and the second conductor, and the bridge conductors are arranged along the extending direction of the signal conductor defining gaps in between.

In this configuration, the overall width of the second ground conductor preferably is made wider while ensuring that the second ground conductor does not overlap with the signal conductor. Further, this configuration enables to electrically connect the first conductor and the second conductor that constitute the second ground conductor, thus setting the first conductor and the second conductor at the same potential.

Further, in the high-frequency transmission line according to a preferred embodiment of the present invention, it is preferable that a sum of the cross-sectional area of the second ground conductor and the cross-sectional area of the third ground conductor is equal to or larger than the cross-sectional area of the signal conductor. Further, in the high-frequency transmission line according to a preferred embodiment of the present invention, the signal conductor, the second ground conductor, and the third ground conductor preferably have the same thickness, and a sum of the width of the second ground conductor and the width of the third ground conductor is preferably equal to or larger than the width of the signal conductor.

These configurations prevent an increase in transmission loss of the high-frequency transmission line caused by the transmission loss due to the return current.

Further, in the high-frequency transmission line according to a preferred embodiment of the present invention, it is preferable that the width of the second ground conductor and the width of the third ground conductor are narrower than the width of the signal conductor. Further, in the high-frequency transmission line according to a preferred embodiment of the present invention, it is preferable that the signal conductor includes a narrow portion in part, and that the width of the second ground conductor and the width of the third ground conductor are narrower than the width of the narrow portion.

These configurations represent specific examples of the signal conductor, the second ground conductor, and the third ground conductor.

According to various preferred embodiments of the present invention, thin and narrow-width high-frequency transmission lines having lower transmission loss are provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 5 is a view depicting flows of currents in the transmission line portion of the high-frequency transmission cable according to the first preferred embodiment of the present invention.

DETAILED DESCRIPTION OF THE PREFERRED EMBODIMENTS

Figure 1:
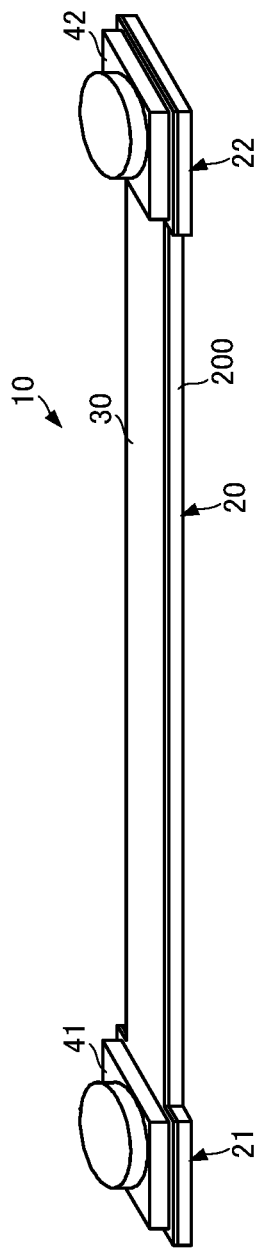
FIG. 1 is an external perspective view of a high-frequency transmission cable according to a preferred embodiment of the present invention.

A high-frequency transmission cable that defines and functions as a high-frequency transmission line according to a first preferred embodiment of the present invention is described with reference to the drawings. FIG. 1 is an external perspective view of a high-frequency transmission cable 10 according to a preferred embodiment of the present invention.

The high-frequency transmission cable 10 is a flat-cable type high-frequency transmission line including a transmission line portion 20 and outer connection portions 21 and 22. The transmission line portion 20 includes a flat plate having an elongated shape extending in one direction. Hereinafter, this extending direction is referred to as a longer-length direction, and a direction perpendicular or substantially perpendicular to the extending direction is referred to as a shorter-length direction. The outer connection portion 21 is located at one end portion of the transmission line portion 20 in the longer-length direction. The outer connection portion 22 is located at the other end portion of the transmission line portion 20 in the longer-length direction. The transmission line portion 20 and the outer connection portions 21 and 22 are integrally defined by a dielectric body 200 having a flat-plate shape and flexibility. Hereinafter, two surfaces of the dielectric body 200 perpendicular or substantially perpendicular to a thickness direction of the dielectric body 200 are referred to as a first principle surface and a second principle surface. In other words, the dielectric body 200 includes a flat plate having a certain thickness and in which the first principle surface and the second principle surface are opposed to each other.

A resist film 30 is located on the first principle surface of the dielectric body 200. The resist film 30 is a resin film having insulation property and flexibility. A connector 41 is disposed on the first principle surface of the dielectric body 200 at a region in the outer connection portion 21. A connector 42 is disposed on the first principle surface of the dielectric body 200 at a region in the outer connection portion 22. The connectors 41 and 42 are connected to a signal conductor 221 which will be described below and a ground conductor 211 although their connecting structures are not illustrated in the drawing. Alternatively, the connectors 41 and 42 may be omitted.

Figure 2:
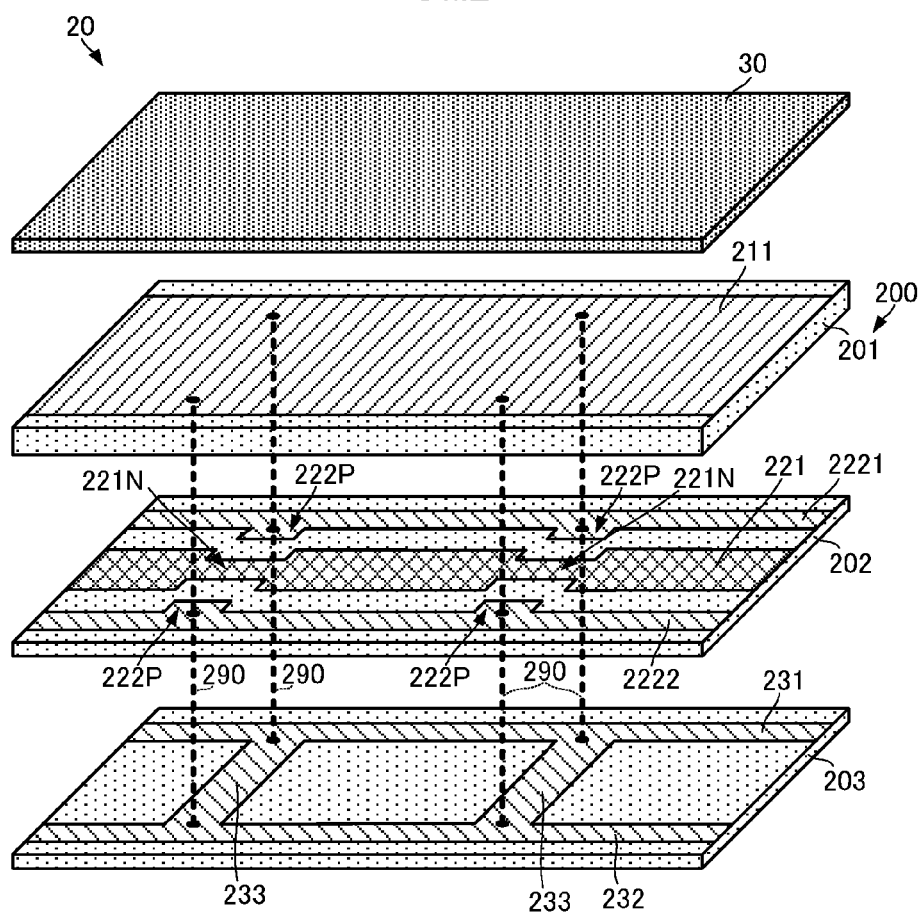
FIG. 2 is an exploded perspective view of a transmission line portion of the high-frequency transmission cable according to the first preferred embodiment of the present invention.
Figure 3A:
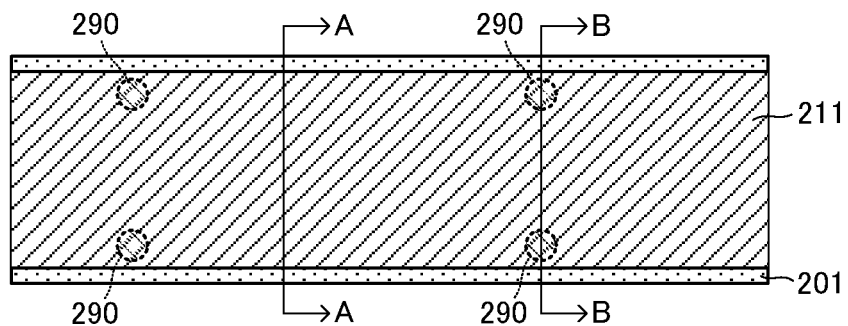
FIGS. 3A, 3B, and 3C are plan views of respective layers of a dielectric body that constitutes the transmission line portion of the high-frequency transmission cable according to the first preferred embodiment of the present invention.
Figure 3B:
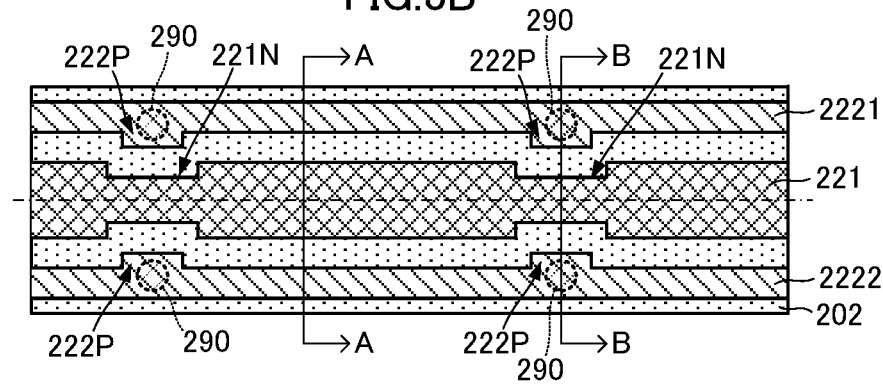
Figure 3C:
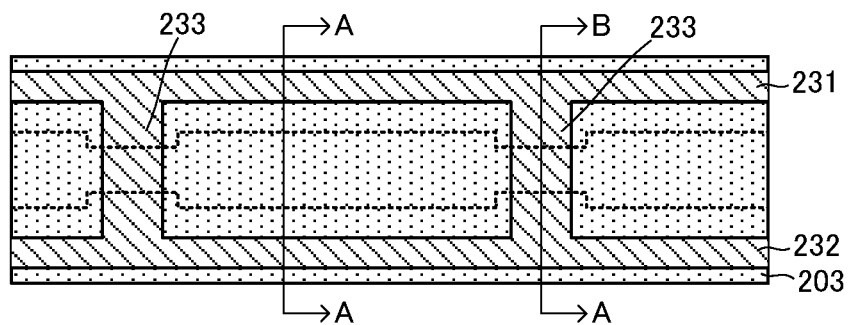
Figure 4A:
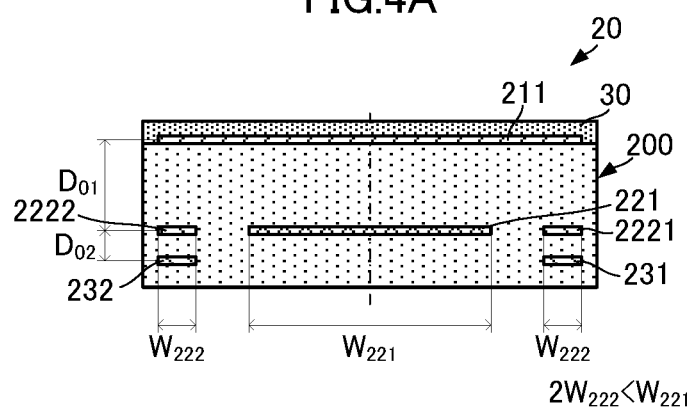
FIG. 4A is a cross-sectional view at line A-A in FIGS. 3A to 3C.

Next, the configuration of the transmission line portion 20 is described in detail with reference to the drawings. FIG. 2 is an exploded perspective view of the transmission line portion of the high-frequency transmission cable according to the first preferred embodiment of the present invention. FIGS. 3A, 3B, and 3C are plan views of respective layers of the dielectric body that constitute the transmission line portion of the high-frequency transmission cable according to the first preferred embodiment of the present invention. FIG. 4A is a cross-sectional view at line A-A in FIGS. 3A to 3C, and FIG. 4B is a cross-sectional view at line B-B in FIGS. 3A to 3C.

The transmission line portion 20 includes the dielectric body 200 formed preferably by stacking dielectric layers 201, 202, and 203. The dielectric layers 201, 202, and 203 are composed of an insulating resin having flexibility and, for example, are composed of a thermoplastic synthetic resin such as a liquid crystal polymer or the like. In the case where the dielectric layers 201, 202, and 203 composed of liquid crystal polymer are used, the dielectric body 200 is fabricated by joining boundary surfaces of the dielectric layers preferably by performing thermocompression-bonding after stacking the layers.

On a surface of the dielectric layer 201 on the first principle surface side, namely, on the first principle surface of the dielectric body 200, the ground conductor 211 is provided. This ground conductor 211 corresponds to a "first ground conductor". The ground conductor 211 is composed of a material having high electrical conductivity and, for example, is composed of a metal foil such as copper (Cu) or the like. The ground conductor 211 covers substantially the whole area of a surface of the dielectric layer 201 on the first principle surface side. In other words, the ground conductor 211 extends across the entire length of the dielectric layer 201 in the longer-length direction (longer-length direction of the dielectric body 200). More specifically, the ground conductor 211 covers the whole surface and has a shape that leaves non-formation portions at both end portions of the dielectric layer 201 in the shorter-length direction. By providing the non-formation portions of the conductor on both the end portions in the shorter-length direction in this manner, the ground conductor 211 is protected from influences (moisture absorption and the like) of an external environment. Further, on the surface of the dielectric layer 201 on the first principle surface side, the resist film 30 is provided.

On a surface of the dielectric layer 202 on the dielectric layer 201 side, the signal conductor 221 and ground conductors 2221 and 2222 are provided. The signal conductor 221 and the ground conductors 2221 and 2222 are composed of a material (for example, a metal foil such as copper or the like) similar to that of the ground conductor 211, and have the same or substantially the same thickness as that of the ground conductor 211. These ground conductors 2221 and 2222 corresponds to a "third ground conductor".

The signal conductor 221 extends along the longer-length direction of the dielectric layer 202. The signal conductor 221 is located at substantially a center of the dielectric layer 202 in the shorter-length direction. The signal conductor 221 is provided with a plurality of narrow portions 221N arranged along the extending direction defining gaps in between. Each narrow portion 221N has a width narrower than the width of another portion of the signal conductor 221, and, in other words, has a shorter length in the shorter-length direction.

The ground conductors 2221 and 2222 extend along the longer-length direction of the dielectric layer 202. The ground conductors 2221 and 2222 have the same width and the same thickness. The ground conductors 2221 and 2222 are structured to have the signal conductor 221 in between in the shorter-length direction of the dielectric layer 202. Here, the ground conductors 2221 and 2222 and the signal conductor 221 extend in the shorter-length direction of the dielectric layer 202 defining gaps in between. Further, the ground conductors 2221 and 2222 extend along the signal conductor 221.

The ground conductors 2221 and 2222 are each provided with a plurality of wide portions 222P arranged along the extending direction defining gaps in between. Each wide portion 222P has a width wider than the width of other portion of the ground conductors 2221 and 2222 and, in other words, has a longer length in the shorter-length direction. The positions of the wide portions 222P provided in the ground conductor 2221 coincide with the positions of the wide portions 222P provided in the ground conductor 2222 in the longer-length direction of the dielectric layer 202.

In the longer-length direction of the dielectric layer 202, the positions of the wide portions 222P of the ground conductors 2221 and 2222 coincide with the positions of the narrow portion 221N of the signal conductor 221. In other words, in the longer-length direction of the dielectric layer 202, the width of the signal conductor 221 becomes narrower at the portion where the widths of the ground conductors 2221 and 2222 become wider. This prevents the gaps between the signal conductor 221 and the ground conductors 2221 and 2222 from becoming partially narrower even in the case where the widths of the ground conductors 2221 and 2222 are made partially wider.

Figure 4B:
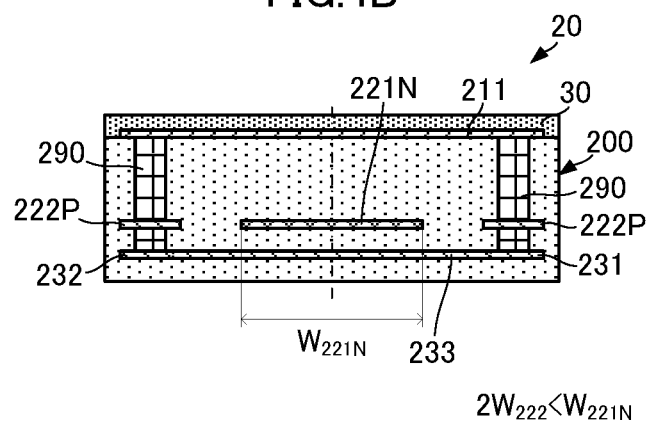
FIG. 4B is a cross-sectional view at line B-B in FIGS. 3A to 3C.

Here, as depicted in FIGS. 4A and 4B, a sum of widths $W_{222}$ of the ground conductors 2221 and 2222 is narrower than a width $W_{221}$ of the signal conductor 221. Namely, $2W_{222} < W_{221}$. Further, a sum of the widths $W_{222}$ of the ground conductors 2221 and 2222 is narrower than a width $W_{221N}$ of the narrow portion 221N of the signal conductor 221. Namely, $2W_{222} < W_{221N}$. The condition $2W_{222} < W_{221N}$ is not essential, but the configuration of the present preferred embodiment becomes more useful in the case where $2W_{222} < W_{221N}$ is satisfied.

On a surface of the dielectric layer 203 on the dielectric layer 202 side, ground conductors 231 and 232 and bridge conductors 233 are provided. The ground conductors 231 and 232 and the bridge conductors 233 are composed of a material similar to those of the other conductors (for example, a metal foil such as copper or the like). These ground conductors 231 and 232 correspond to a "second ground conductor".

The ground conductors 231 and 232 extend along the longer-length direction of the dielectric layer 203. The ground conductors 231 and 232 are located near both ends of the dielectric layer 203 in the shorter-length direction. The ground conductors 231 and 232 have the same width or substantially the same width as the width of the ground conductors 2221 and 2222. The ground conductor 231 overlaps with the ground conductor 2221 when the dielectric body 200 is viewed in a direction perpendicular or substantially perpendicular to the first principle surface and the second principle surface. The ground conductor 232 overlaps with the ground conductor 2222 when the dielectric body 200 is viewed in the direction perpendicular or substantially perpendicular to the first principle surface and the second principle surface. According to the foregoing configuration, the ground conductors 231 and 232 do not overlap with the signal conductor 221 when the dielectric body 200 is viewed in the direction perpendicular or substantially perpendicular to the first principle surface and the second principle surface.

Here, as depicted in FIGS. 4A and 4B, the width of the ground conductors 231 and 232 is $W_{222}$, the same as the width of the ground conductors 2221 and 2222. However, the total width of the widths of the ground conductors 231 and 232 and the widths of the ground conductors 2221 and 2222 is equal to or larger than the width $W_{221}$ of the signal conductor 221. Namely, $4W_{222} \geq W_{221}$, and at least $4W_{222} \geq W_{221N}$ may be satisfied.

The bridge conductor 233 extends in the shorter-length direction of the dielectric layer 203 and connects the ground conductors 231 and 232. A plurality of the bridge conductors 233 is provided along the longer-length direction of the dielectric layer 203 defining gaps in between. In the longer-length direction of the dielectric body 200, the positions of the bridge conductors 233 coincide with the positions of the wide portions 222P of the ground conductors 2221 and 2222.

The ground conductor 211, the ground conductors 2221 and 2222, and the ground conductors 231 and 232 are connected via interlayer-connector conductors 290 that penetrate through the dielectric layers 201 and 202. The interlayer-connector conductor 290 is, for example, a via-hole conductor, and formed, for example, by providing an electrically conductive paste that includes one or more metals selected from a group of Ag, Ni, Cu, and Sn to a through-hole formed in the dielectric layers 201 and 202 and by performing thermal solidification. In the case where the dielectric layers 201, 202, and 203 composed of liquid crystal polymer are used, heat during the process of thermocompression-bonding of the dielectric layers 201, 202, and 203 solidifies the electrically conductive paste that filled the through-hole. The interlayer-connector conductors 290 are formed at positions that pass inside the wide portions 222P of the ground conductors 2221 and 2222 when the dielectric body 200 is viewed in the direction perpendicular or substantially perpendicular to the first principle surface and the second principle surface. In other words, the interlayer-connector conductors 290 connect the ground conductors 231 and 232 at positions where the bridge conductors 233 are connected. This configuration enables the ground conductor 211, the ground conductors 2221 and 2222, and the ground conductors 231 and 232 to be at substantially the same potential, namely, enables to keep these conductors at ground potential. Accordingly, as described in the present preferred embodiment, by providing the wide portions 222P in the ground conductors 2221 and 2222, connecting the interlayer-connector conductors 290 and the ground conductors 2221 and 2222 at the wide portions 222P, and connecting the interlayer-connector conductors 290 and the ground conductors 231 and 232 at the positions where the bridge conductors 233 are connected, the radius of the interlayer-connector conductor 290 may be made larger, and connection reliability of the interlayer-connector conductor 290 may be made higher, thus achieving low resistance of the interlayer-connector conductor 290 even in the case where the widths of the ground conductors 2221 and 2222 and the ground conductors 231 and 232 are narrowed.

Further, the foregoing configuration makes it possible to form the transmission line portion 20, which is of a stripline type having the signal conductor 221 as a main line, into a thin shape. In this case, in the transmission line portion 20, coupling between the signal conductor 221 and the ground conductor 211 becomes strong. Thus, the ground conductor 211 becomes a main ground, and the ground conductors 2221 and 2222 and the ground conductors 231 and 232 become sub grounds. Further, the ground conductors 2221 and 2222 and the ground conductors 231 and 232 may shield electromagnetic waves leaking from the signal conductor 221 to outside.

The characteristic impedance of the foregoing transmission line portion 20 is basically determined according to the shapes of the signal conductor 221 and the ground conductor 211 or spatial relationship therebetween, and characteristics of materials in the dielectric body 200. In other words, the width $W_{221}$ of the signal conductor 221 and a distance between the signal conductor 221 and the ground conductor 211 (thickness $D_{01}$ of the dielectric layer 201) depicted in FIGS. 4A and 4B determines basic characteristic impedance. The characteristic impedance is finally set to a desired value (for example, about 50Ω) after evaluating coupling between the signal conductor 221 and the ground conductors 2221, 2222, 231, and 232. In other words, the characteristic impedance is determined based on the width $W_{222}$ of the ground conductors 2221, 2222, 231, and 232, the spatial relationship between the signal conductor 221 and the ground conductors 2221, 2222, 231, and 232, and the like.

For example, specifically, as depicted in FIGS. 4A and 4B, by making the thickness $D_{01}$ of the dielectric layer 201 thicker than a thickness $D_{02}$ of the dielectric layer 202, a distance between the signal conductor 221 and the ground conductor 211 is made equal to or larger than half of the thickness of the dielectric body 200. In other words, the signal conductor 221 is offset in the thickness direction of the dielectric body 200 away from a center in the thickness direction and toward a side opposite to the ground conductor 211 side. With the foregoing configuration, the characteristic impedance is set to a desired value by reducing capacitive coupling between the signal conductor 221 and the ground conductor 211.

Further, in the transmission line portion 20 as configured above, currents flow in the respective conductors as depicted in FIG. 5 when a high-frequency signal travels. FIG. 5 is a view depicting flows of the currents in the transmission line portion of the high-frequency transmission cable according to the first preferred embodiment of the present invention.

As depicted in FIG. 5, in the case where a high-frequency signal is transmitted using the transmission line portion 20, a signal current Ss flows in the signal conductor 221. At the timing depicted in FIG. 5, the signal current Ss is flowing in a first direction in the longer-length direction.

When the signal current Ss flows in the signal conductor 221, return currents Srs flow in the ground conductors 2221, 2222, 231, and 232, and a return current $Sr_G$ flows in the ground conductor 211. In this case, the return currents Srs and $Sr_G$ flow in the reverse direction to the signal current Ss, namely, a second direction opposite to the first direction depicted in FIG. 5.

Here, as described above, the total width of the widths of the ground conductors 231 and 232 and the widths of the ground conductors 2221 and 2222 is equal to or larger than the width $W_{221}$ of the signal conductor 221. Accordingly, a sum of cross-sectional areas of the ground conductors 2221, 2222, 231, and 232 cut in a direction perpendicular or substantially perpendicular to the extending direction is equal to or larger than the cross-sectional area of the signal conductor 221 cut in the direction perpendicular or substantially perpendicular to the extending direction.

Thus, a pure resistance (direct current resistance) of the ground conductors 2221, 2222, 231, and 232 is equal to or less than a pure resistance of the signal conductor 221. Accordingly, a transmission loss of high-frequency signal due to the ground conductors 2221, 2222, 231, and 232 is equal to or less than a transmission loss of high-frequency signal due to the signal conductor 221.

This prevents an increase in transmission loss of the transmission line portion 20 due to the ground conductors 2221, 2222, 231, and 232. Thus, the transmission line portion 20 with low loss is provided.

Unlike configurations in the related art, in this case, the transmission loss due to the ground conductors preferably is significantly reduced or prevented by providing the ground conductors on a plurality of layers even in the case where the width of each ground conductor is narrow. Thus, the width of the dielectric body 200, namely, the width of the transmission line portion 20 may be made narrower compared to the width of the configuration in the related art. Particularly, as described in the present preferred embodiment, by arranging a portion of the ground conductors and the signal conductor at the same layer, namely, the same position in the thickness direction of the dielectric body 200, the thickness of the dielectric body 200 is prevented from becoming thicker even in the case where more ground conductors are used. In this way, the thin and narrow-width transmission line portion 20 is provided.

Figure 6:
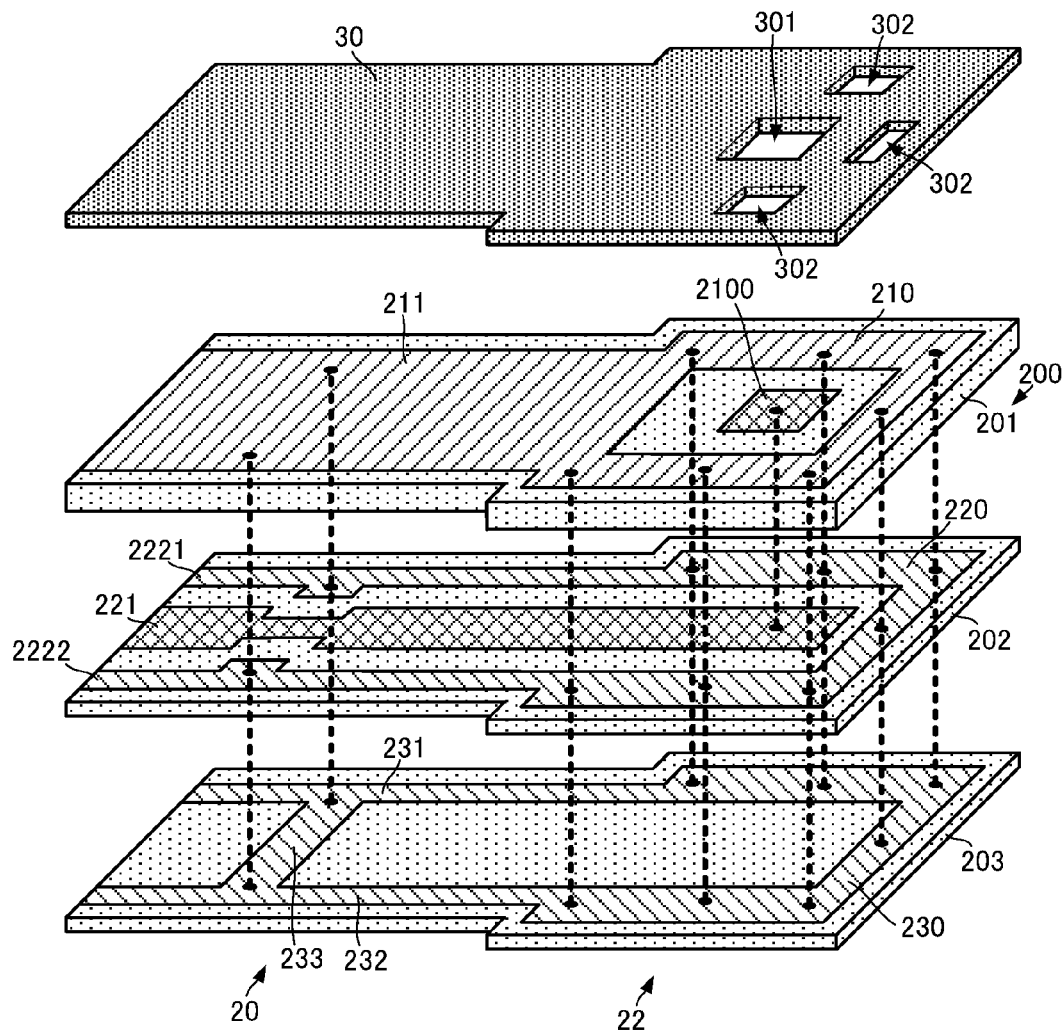
FIG. 6 is an exploded perspective view of an outer connection portion of the high-frequency transmission cable according to the first preferred embodiment of the present invention.

Next, configurations of the outer connection portions 21 and 22 are described in detail with reference to the drawings. FIG. 6 is an exploded perspective view of the outer connection portion of the high-frequency transmission cable according to the first preferred embodiment of the present invention. Although FIG. 6 depicts the outer connection portion 22, the outer connection portion 21 also has a similar configuration.

As described above, the outer connection portion 22 is integrally defined by the dielectric body 200 together with the transmission line portion 20. The portion of the dielectric body 200 corresponding to the outer connection portion 22 has a wider width compared to the portion corresponding to the transmission line portion 20. Alternatively, these portions may have the same width or substantially the same width.

On the surface of the dielectric layer 201 on the first principle surface side, a ground-connector conductor 210 is provided. The ground-connector conductor 210 is connected to the ground conductor 211 of the transmission line portion 20. The ground-connector conductor 210 covers substantially the whole area of a region in the dielectric layer 201 corresponding to the outer connection portion 22. A no-conductor-formed portion is provided in a middle of the ground-connector conductor 210. Inside the no-conductor-formed portion, a signal-connector conductor 2100 is provided. The signal-connector conductor 2100 has an area large enough to provide the interlayer-connector conductor 290.

On the surface of the dielectric layer 202 on the dielectric layer 201 side, an end portion region in the extending direction of the signal conductor 221 and a ground-connector conductor 220 are provided. The ground-connector conductor 220 is connected to the ground conductors 2221 and 2222. The ground-connector conductor 220 overlaps with the ground-connector conductor 210 when the dielectric body 200 is viewed in the direction perpendicular or substantially perpendicular to the first principle surface and the second principle surface.

On the surface of the dielectric layer 203 on the dielectric layer 202 side, a ground-connector conductor 230 is connected to the ground conductors 231 and 232. The ground-connector conductor 230 overlaps with the ground-connector conductors 210 and 220 when the dielectric body 200 is viewed in the direction perpendicular or substantially perpendicular to the first principle surface and the second principle surface.

The ground-connector conductors 210, 220, and 230 are connected to each other by a plurality of the interlayer-connector conductors 290. The signal conductor 221 and the signal-connector conductor 2100 are connected to each other by another interlayer-connector conductor 290 different from the interlayer-connector conductors used to connect the ground-connector conductors 210, 220, and 230.

A region in the resist film 30 corresponding to the outer connection portion 22 is provided with openings 301 and 302. The opening 301 exposes the signal-connector conductor 2100 to outside on the resist film 30 side. The opening 302 exposes the ground-connector conductor 210 to outside on the resist film 30 side. These openings 301 and 302 allow the signal-connector conductor 2100 and the ground-connector conductor 210 connecting to respective ports of the connector 42 via an electrically conductive material such as solder or the like. Alternatively, the connectors 41 and 42 may be omitted. In that case, the signal-connector conductor 2100 exposed from the opening 301 and the ground-connector conductors 210 exposed from the openings 302 serve as respective outer ports.

The high-frequency transmission cable including the foregoing configuration may be fabricated, for example, in the following manner.

Initially, first, second, and third dielectric sheets are prepared. The first, second, and third dielectric sheets are liquid crystal polymer sheets having copper cladding on one side. The ground conductor 211, the ground-connector conductor 210, and the signal-connector conductor 2100 are formed on the first dielectric sheet on the first principle surface side by patterning. The signal conductor 221, the ground conductors 2221 and 2222, and the ground-connector conductor 220 are formed on the second dielectric sheet on the first principle surface side by patterning. The ground conductors 231 and 232, the bridge conductors 233, and the ground-connector conductor 230 are formed on the third dielectric sheet on the first principle surface side by patterning. On each one of the first, second, and third dielectric sheets, a plurality of sets of the respective conductors is formed and arrayed.

Through-holes are formed in the first and second dielectric sheets at positions where the interlayer-connector conductors 290 are to be formed, and are filled with an electrically conductive paste.

The first, second, and third dielectric sheets are stacked on top of each other and subjected to thermocompression-bonding. This thermocompression-bonding solidifies the electrically conductive paste, thus forming the interlayer-connector conductors 290. In this way, a multilayer dielectric sheet, in which a plurality of the dielectric bodies 200 is formed and arrayed, is formed.

The resist film 30 is attached to the dielectric bodies 200, and the connectors 41 and 42 are mounted thereon using an electrically conductive material such as solder or the like. In this way, a composite body, in which a plurality of the high-frequency transmission cables 10 is formed and arrayed, is formed. This composite body is cut apart into individual high-frequency transmission cables 10.

Figure 7A:
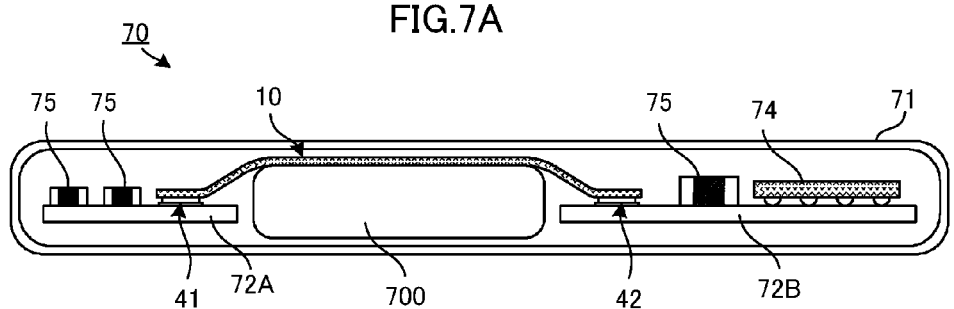
FIG. 7A and FIG. 7B are a side cross-sectional view and a plane cross-sectional view of a component configuration of mobile electronic equipment according to the first preferred embodiment of the present invention, respectively.
Figure 7B:
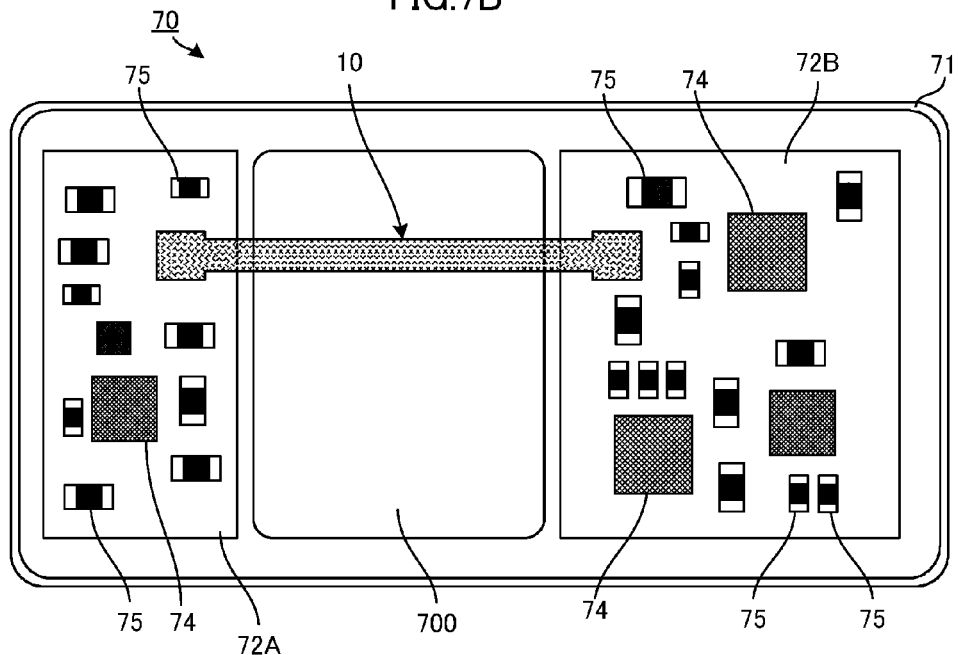

The high-frequency transmission cable 10 including the foregoing configuration may be used for the following non-limiting examples of mobile electronic equipment. FIG. 7A is a side cross-sectional view of a component configuration of mobile electronic equipment according to the first preferred embodiment of the present invention, and FIG. 7B is a plane cross-sectional view of the component configuration of mobile electronic equipment.

Mobile electronic equipment 70 includes a thin equipment casing 71. Mount circuit boards 72A and 72B and a battery pack 700 are arranged inside the equipment casing 71. On surfaces of the mount circuit boards 72A and 72B, a plurality of IC chips 74 and a plurality of mount components 75 are mounted. The mount circuit boards 72A and 72B and the battery pack 700 are arranged in the equipment casing 71 in such a way that the battery pack 700 is arranged between the mount circuit boards 72A and 72B in a planar view of the equipment casing 71. Here, the equipment casing 71 preferably has a minimum possible thickness. Thus, in the thickness direction of the equipment casing 71, a gap between the battery pack 700 and the equipment casing 71 is considerably narrow, and a coaxial cable may not be disposed therebetween.

However, the high-frequency transmission cable 10 according to a preferred embodiment of the present invention is arranged in such a way that the thickness direction of the high-frequency transmission cable 10 coincides with the thickness direction of the equipment casing 71. Thus, the high-frequency transmission cable 10 may be interposed between the battery pack 700 and the equipment casing 71. In this way, the mount circuit boards 72A and 72B, which are separated from each other having the battery pack 700 in the middle, may be connected with the high-frequency transmission cable 10.

Further, as described in the present preferred embodiment, the high-frequency transmission cable 10 is capable of transmitting high frequency signals with low loss. Thus, high frequency signals may be transmitted with low loss between the mount circuit boards 72A and 72B.

Next, a high-frequency transmission cable according to a second preferred embodiment of the present invention is described with reference to the drawings. A high-frequency transmission cable 10A according to the present preferred embodiment is different from the high-frequency transmission cable 10 according to the first preferred embodiment in a configuration of a transmission line portion 20A. Thus, only the configuration of the transmission line portion 20A is described in detail.

Figure 8:
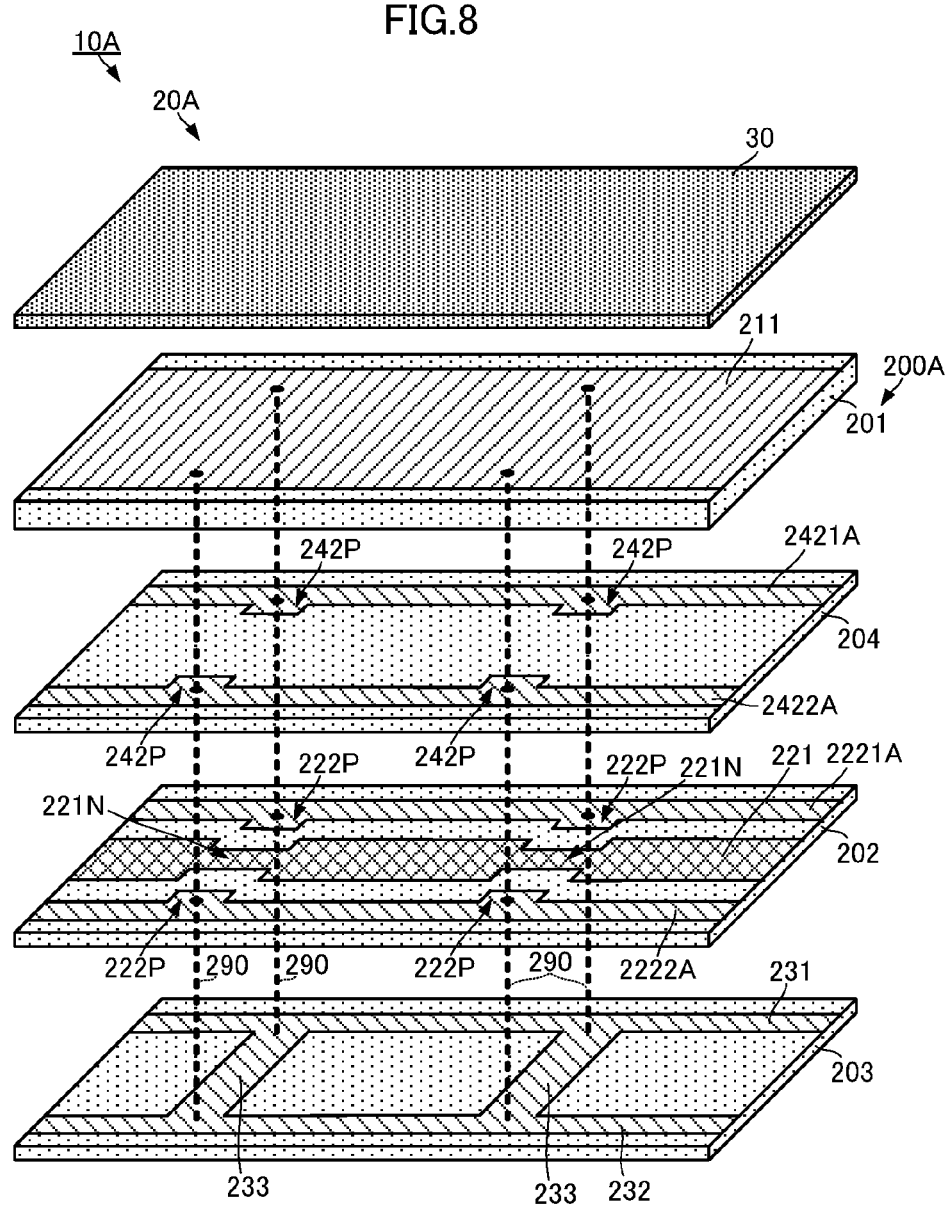
FIG. 8 is an exploded perspective view of a transmission line portion of a high-frequency transmission cable according to a second preferred embodiment of the present invention.
Figure 9:
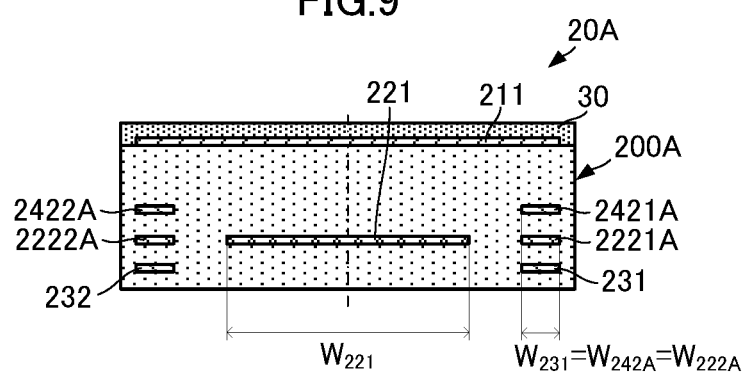
FIG. 9 is a cross-sectional view of the transmission line portion of FIG. 8 within a range where a signal conductor is not at a narrow portion.

FIG. 8 is an exploded perspective view of a transmission line portion of a high-frequency transmission cable according to the second preferred embodiment of the present invention. FIG. 9 is a cross-sectional view of the transmission line portion of FIG. 8 within a range where the signal conductor 221 is not at the narrow portion 221N.

The transmission line portion 20A includes a dielectric body 200A. The dielectric body 200A is formed preferably by adding a dielectric layer 204 to the dielectric body 200 described in the first preferred embodiment, and the basic configuration of the other dielectric layers is preferably the same as that of the dielectric body 200 of the first preferred embodiment. Thus, similarly, only the different portion of the transmission line portion 20A is described in detail.

The dielectric layer 204 is arranged between the dielectric layer 201 and the dielectric layer 202. On a surface of the dielectric layer 204 on the dielectric layer 201 side, ground conductors 2421A and 2422A are provided. These ground conductors 2421A and 2422A correspond to the "third ground conductor".

The ground conductors 2421A and 2422A extend along the longer-length direction of the dielectric layer 204. The ground conductors 2421A and 2422A are located near both ends of the dielectric layer 204 in the shorter-length direction. The ground conductor 2421A overlaps with the ground conductor 2221A of the dielectric layer 202 and the ground conductor 231 of the dielectric layer 203 when the dielectric body 200A is viewed in the direction perpendicular or substantially perpendicular to the first principle surface and the second principle surface thereof. The ground conductor 2422A overlaps with the ground conductor 2222A of the dielectric layer 202 and the ground conductor 232 of the dielectric layer 203 when the dielectric body 200A is viewed in the direction perpendicular or substantially perpendicular to the first principle surface and the second principle surface. According to this configuration, the ground conductors 2421A and 2422A do not overlap with the signal conductor 221 when the dielectric body 200A is viewed in the direction perpendicular or substantially perpendicular to the first principle surface and the second principle surface.

The ground conductors 2421A and 2422A are each provided with a plurality of wide portions 242P arranged along the extending direction defining gaps in between. Each wide portion 242P has a width wider than the width of other portions of the ground conductors 2421A and 2422A and, in other words, has a longer length in the shorter-length direction. The positions of the wide portions 242P provided in the ground conductor 2421A coincide with the positions of the wide portions 242P provided in the ground conductor 2422A in the longer-length direction of the dielectric layer 204. Further, each wide portion 242P overlaps with the wide portion 222P when the dielectric body 200A is viewed in the direction perpendicular or substantially perpendicular to the first principle surface and the second principle surface.

The ground conductor 2421A is connected to the ground conductors 2221A and 231 and the ground conductor 211 via the interlayer-connector conductors 290. The ground conductor 2422A is connected to the ground conductors 2222A and 232 and the ground conductor 211 via the interlayer-connector conductors 290.

As depicted in FIG. 9, in the transmission line portion 20A of the present preferred embodiment, a width $W_{222A}$ of the ground conductors 2221A and 2222A, a width $W_{242A}$ of the ground conductors 2421A and 2422A, and a width $W_{231}$ of the ground conductors 231 and 232 are the same. Namely, $W_{242A}=W_{222A}=W_{231}$. Such configuration allows the ground conductor to be provided in more layers, and degradation of transmission loss in the transmission line portion 20A is significantly reduced or prevented by reducing the transmission loss due to the return currents even in the case where the width of each ground conductor is made narrow.

Next, a high-frequency transmission cable according to a third preferred embodiment of the present invention is described with reference to the drawings. A high-frequency transmission cable 10B according to the present preferred embodiment is different from the high-frequency transmission cable 10A according to the second preferred embodiment in that a transmission line portion 20B differs from the transmission line portion 20A in configuration. Specifically, the widths of the ground conductors in the respective layers are different from those of the transmission line portion 20A described in the second preferred embodiment. Thus, only the configuration of widths of the respective ground conductors of the transmission line portion 20B are described in detail.

Figure 10:
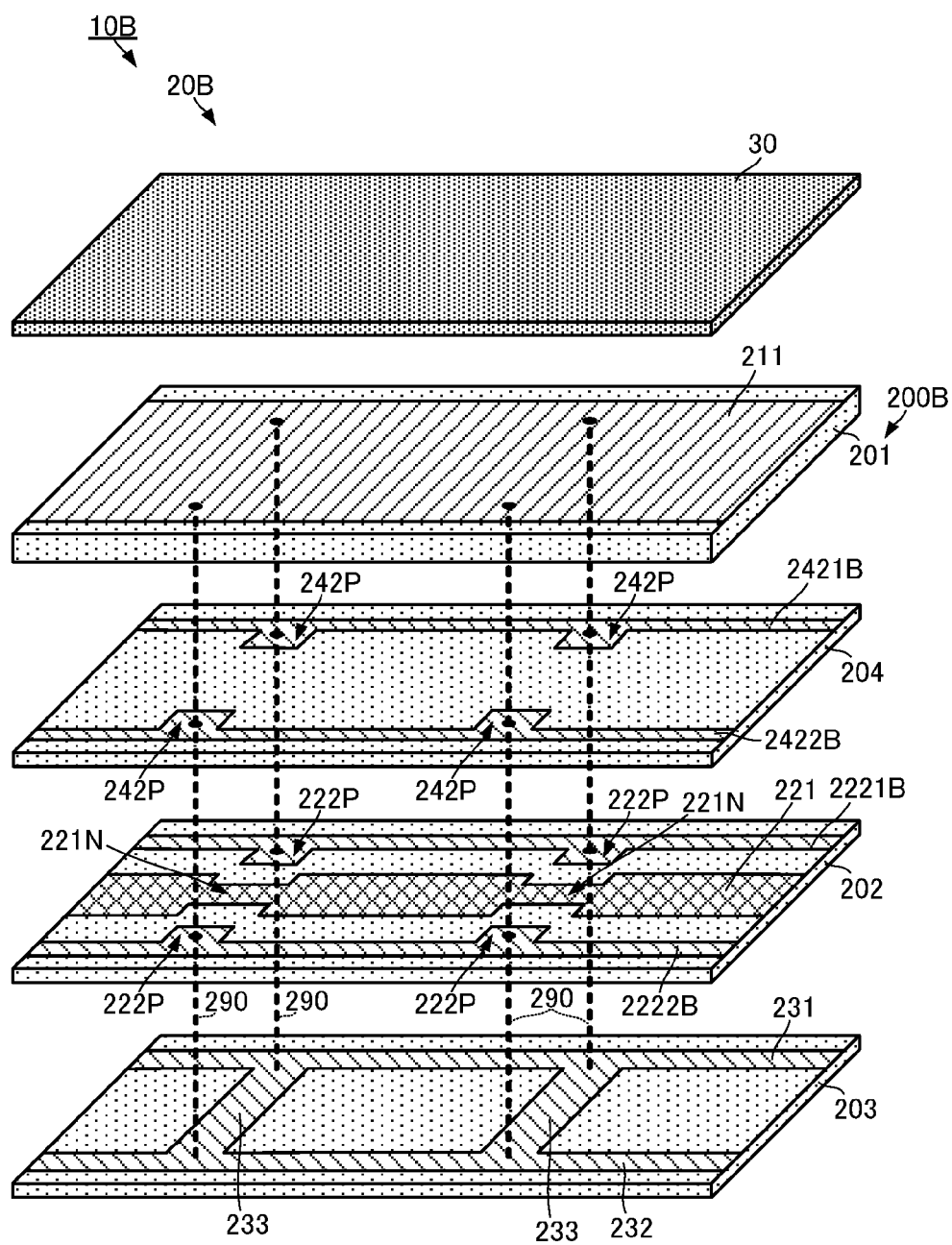
FIG. 10 is an exploded perspective view of a transmission line portion of a high-frequency transmission cable according to a third preferred embodiment of the present invention.
Figure 11:
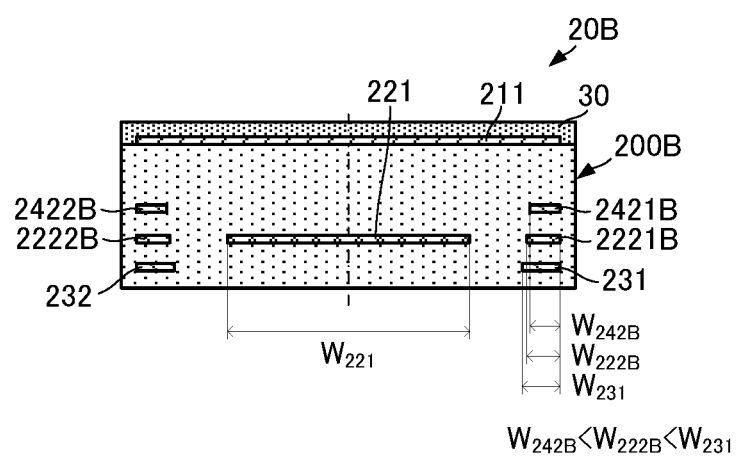
FIG. 11 is a cross-sectional view of the transmission line portion of FIG. 10 within a range where a signal conductor is not at a narrow portion.

FIG. 10 is an exploded perspective view of a transmission line portion of a high-frequency transmission cable according to a third preferred embodiment of the present invention. FIG. 11 is a cross-sectional view of the transmission line portion of FIG. 10 within a range where the signal conductor 221 is not at the narrow portion 221N.

As depicted in FIGS. 10 and 11, a width $W_{222B}$ of ground conductors 2221B and 2222B is narrower than the width $W_{231}$ of the ground conductors 231 and 232. Further, a width $W_{242B}$ of ground conductors 2421B and 2422B is narrower than the width $W_{222B}$ of the ground conductors 2221B and 2222B. In other words, $W_{242B} < W_{222B} < W_{231}$, and the width of ground conductor becomes narrower as the position of ground conductor becomes closer to the ground conductor 211.

Such configuration significantly reduces or prevents capacitive coupling between the narrow-width ground conductors and the ground conductor (first ground conductor) formed across the whole area of a principle surface even in the case where the ground conductors are provided in a plurality of layers. In other words, the capacitive coupling between the narrow-width ground conductors and the ground conductor extending across the whole area of the principle surface is significantly reduced or prevented while widening the total width including widths of a plurality of the narrow-width ground conductors.

In the present preferred embodiment, the example is described, in which the width of the narrow-width ground conductor becomes narrower as the position thereof becomes closer to the ground conductor that extends across the whole area of the principle surface. Alternatively, the same width may be used for the ground conductors that are located closer to the ground conductor 211 than the ground conductors 231 and 232 are so long as that width is narrower than the width of the ground conductors 231 and 232.

Further, the narrow-width ground conductor may be provided in a different layer disposed in the thickness direction. In this case, each narrow-width ground conductor may be arranged so as not to overlap with the signal conductor when the dielectric body is viewed in the direction perpendicular or substantially perpendicular to the first principle surface and the second principle surface.

In the foregoing description, the cases are described where each conductor preferably has the same thickness. However, the functions and effects of various preferred embodiments of the present invention may still be obtained so long as a sum of the cross-sectional areas of the narrow-width ground conductors through which the return currents flow is equal to or larger than the cross-sectional area of the signal conductor through which the signal current flows. Thus, in a case where the conductors have different thicknesses, or, for example, in a case where thicknesses of the signal conductor and the ground conductor located on the same layer as the signal conductor are thicker than thicknesses of the ground conductors placed on the other layers, the narrow-width ground conductors and the signal conductor preferably are structured such that the sum of the cross-sectional areas of the narrow-width ground conductors is equal to or larger than the cross-sectional area of the signal conductor.

Further, in the foregoing description, the high-frequency transmission cables are non-limiting examples of the high-frequency transmission line. However, the present invention is not limited thereto. For example, in one preferred embodiment, the present invention may be configured as a high-frequency transmission line portion that defines a portion of a circuit board.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency transmission line comprising:
a dielectric body including a first principle surface and a second principle surface that oppose each other;
a signal conductor extending in a predetermined direction and located at an intermediate position of the dielectric body in a thickness direction perpendicular or substantially perpendicular to the first principle surface and the second principle surface;
a first ground conductor that is located closer to the first principle surface than the signal conductor is;
a second ground conductor that is located closer to the second principle surface than the signal conductor is;
a third ground conductor located at a position different from a position of the second ground conductor in the thickness direction, the third ground conductor overlapping with the second ground conductor and not overlapping with the signal conductor, and being connected to the second ground conductor; and
a plurality of interlayer-connector conductors that connect the second ground conductor and the third ground conductor; wherein the third ground conductor includes a plurality of wide portions and a plurality of narrow portions, and is connected to the second ground conductor via the plurality of interlayer-connector conductors at the wide portions; and the interlayer-connector conductors protrude beyond the narrow portions toward a side of the signal conductor.

2. The high-frequency transmission line according to claim 1, wherein a sum of a cross-sectional area of the second ground conductor and a cross-sectional area of the third ground conductor is equal to or larger than a cross-sectional area of the signal conductor.

3. The high-frequency transmission line according to claim 2, wherein
the signal conductor, the second ground conductor, and the third ground conductor have a same thickness or substantially a same thickness; and
a sum of a width of the second ground conductor and a width of the third ground conductor is equal to or larger than a width of the signal conductor.

4. The high-frequency transmission line according to claim 1, wherein a width of the second ground conductor and a width of the third ground conductor are narrower than a width of the signal conductor.

5. The high-frequency transmission line according to claim 4, wherein
the signal conductor includes a narrow portion; and
the width of the second ground conductor and the width of the third ground conductor are narrower than a width of the narrow portion.

6. The high-frequency transmission line according to claim 1, wherein the second ground conductor does not overlap with the signal conductor in the thickness direction and has a width narrower than a width of the signal conductor.

7. The high-frequency transmission line according to claim 1, wherein the third ground conductor and the signal conductor are located at a same position in the thickness direction.

8. The high-frequency transmission line according to claim 1, wherein a width of the third ground conductor is narrower than a width of the second ground conductor.

9. The high-frequency transmission line according to claim 1, wherein the second ground conductor includes:
- a first conductor and a second conductor that are arranged along a direction perpendicular or substantially perpendicular to an extending direction of the signal conductor defining a gap in between; and
- bridge conductors that connect the first conductor and the second conductor, the bridge conductors being arranged along the extending direction of the signal conductor defining gaps in between.

* * * * *